(12) United States Patent
Tian et al.

(10) Patent No.: US 11,223,183 B2
(45) Date of Patent: Jan. 11, 2022

(54) TEMPERATURE CONTROL OF AN OPTICAL DEVICE

(71) Applicant: Go!Foton Holdings, Inc., Somerset, NJ (US)

(72) Inventors: Feng Tian, Salem, NH (US); Chi Kong Paul Ng, Princeton, NJ (US)

(73) Assignee: Go!Foton Holdings, Inc., Somerset, NJ (US)

( * ) Notice: Subject to any disclaimer, the term of this patent is extended or adjusted under 35 U.S.C. 154(b) by 0 days.

(21) Appl. No.: 16/749,093

(22) Filed: Jan. 22, 2020

(65) Prior Publication Data
US 2020/0161827 A1 May 21, 2020

Related U.S. Application Data

(62) Division of application No. 15/978,295, filed on May 14, 2018, now Pat. No. 10,566,762.
(Continued)

(51) Int. Cl.
*H04B 10/572* (2013.01)
*H01S 5/024* (2006.01)
(Continued)

(52) U.S. Cl.
CPC ............ *H01S 5/02415* (2013.01); *G02B 5/20* (2013.01); *G02B 5/28* (2013.01); *G02B 26/001* (2013.01); *G05D 23/2451* (2013.01); *H01L 25/167* (2013.01); *H01S 5/0687* (2013.01); *H04B 10/272* (2013.01); *H04B 10/40* (2013.01); *H04B 10/503* (2013.01); *H04B 10/572* (2013.01);
(Continued)

(58) Field of Classification Search
CPC ..................................................... H04B 10/572
See application file for complete search history.

(56) References Cited

U.S. PATENT DOCUMENTS

| 6,525,305 | B2 | 2/2003 | Deschamps et al. |
| 2003/0039276 | A1 | 2/2003 | Tatsuno et al. |
| | | (Continued) | |

OTHER PUBLICATIONS

International Search Report from Application No. PCT/US2018/032492, dated Jul. 26, 2018, 3 pages.
(Continued)

*Primary Examiner* — Shi K Li
(74) *Attorney, Agent, or Firm* — Lerner, David, Littenberg, Krumholz & Mentlik, LLP

(57) ABSTRACT

The present disclosure is directed to an optical device including at least one temperature-dependent tunable element for controlling a wavelength of an optical signal, a first temperature control circuit for controlling a temperature of a first region of the optical device; and a second temperature control circuit for controlling a temperature of a second region of the optical device. The second region may include a portion of the first region. The second region may be smaller than the first region. The tunable element may be positioned in the second region such that a temperature of the tunable element is controlled based on the second temperature control circuit controlling the temperature of the second region. The tunable element may be one of (i) a laser for transmitting an outgoing optical signal and (ii) an optical filter coupled to a photodetector for receiving an incoming optical signal.

21 Claims, 9 Drawing Sheets

Related U.S. Application Data

(60) Provisional application No. 62/635,207, filed on Feb. 26, 2018, provisional application No. 62/507,279, filed on May 17, 2017, provisional application No. 62/507,283, filed on May 17, 2017.

(51) Int. Cl.
| | |
|---|---|
| *H01L 25/16* | (2006.01) |
| *G02B 5/20* | (2006.01) |
| *H04J 14/02* | (2006.01) |
| *H04B 10/272* | (2013.01) |
| *G02B 26/00* | (2006.01) |
| *H01S 5/0687* | (2006.01) |
| *G02B 5/28* | (2006.01) |
| *G05D 23/24* | (2006.01) |
| *H04B 10/40* | (2013.01) |
| *H04B 10/50* | (2013.01) |
| *H04B 10/69* | (2013.01) |
| *H01S 5/06* | (2006.01) |
| *H01S 5/068* | (2006.01) |

(52) U.S. Cl.
CPC .......... *H04B 10/69* (2013.01); *H04J 14/0282* (2013.01); *H01S 5/0612* (2013.01); *H01S 5/06804* (2013.01)

(56) References Cited

U.S. PATENT DOCUMENTS

| | | |
|---|---|---|
| 2003/0044132 A1 | 3/2003 | Nasu et al. |
| 2004/0004980 A1 | 1/2004 | Mazed |
| 2007/0047603 A1 | 3/2007 | Oomori |
| 2007/0280695 A1 | 12/2007 | Li et al. |
| 2010/0246614 A1* | 9/2010 | Koshi ............ H01S 5/0683 372/20 |
| 2012/0014398 A1 | 1/2012 | Choi |
| 2013/0170833 A1* | 7/2013 | Nagarajan ........ G02B 6/12026 398/48 |
| 2014/0119396 A1 | 5/2014 | Dvir et al. |
| 2015/0063812 A1* | 3/2015 | Dove ............ H04B 10/572 398/67 |
| 2015/0139651 A1* | 5/2015 | Xuejin ............ H04J 14/0223 398/75 |
| 2016/0111856 A1 | 4/2016 | Yan et al. |
| 2016/0268771 A1* | 9/2016 | Ding ............ H04Q 11/0067 |
| 2016/0308329 A1* | 10/2016 | Ishii ............ G02B 6/4281 |
| 2017/0093518 A1 | 3/2017 | Barnard |

OTHER PUBLICATIONS

International Search Report from Application No. PCT/US2018/032494, dated Aug. 1, 2018, 3 pages.

* cited by examiner

TEMPERATURE CONTROL OF AN OPTICAL DEVICE

CROSS-REFERENCE TO RELATED APPLICATIONS

The present application is a divisional of U.S. patent application Ser. No. 15/978,295 filed May 14, 2018, which claims the benefit of the filing date of U.S. Provisional Patent Application No. 62/507,279 filed May 17, 2017, U.S. Provisional Patent Application No. 62/507,283 filed May 17, 2017, and U.S. Provisional Patent Application No. 62/635,207 filed Feb. 26, 2018, the disclosures of which are hereby incorporated herein by reference

BACKGROUND OF THE INVENTION

In optical transmission systems, cables, such as fiber-optic cables, are used to transmit information. In some systems, the cables extend from an optical line terminal ("OLT") or other optical device to one or more optical network units ("ONUs"). Optical signals of a certain group of wavelengths are transmitted (upstream signal) from the optical device to the ONUs. Additionally, optical signals of a certain group of wavelengths, which may be different from the group of wavelengths of the transmitted optical signals, are received (downstream signal) from the ONUs at the optical device.

In order for the optical device to transmit or receive at a desired wavelength from among the group of wavelengths, the device must be tuned. For an upstream signal, the signal generator (e.g., laser) of the device may be tunable to provide what is effectively a "pre-filtered" signal. Alternatively, the laser may transmit an optical signal to a destination ONU with an optical transmission made up of multiple wavelengths (with minimal or no filtering applied), and the optical signal can be filtered from the transmission at the destination ONU. Similarly, the ONU may transmit a multiple-wavelength optical signal to the optical device, and the signal can be filtered at the optical device. In order to filter such a signal, a tunable optical filter may be provided. To accommodate for transmitting and receiving both "pre-filtered" and non-"pre-filtered" optical signals, the optical device may include either or both of a laser and optical filter that can be tuned to a frequency that corresponds to the desired wavelength. Conventionally, this tuning is performed by changing the temperature of the laser/optical filter. Thus, tuning at the optical device may be performed using a temperature dependent tunable element.

As passive optical networks (PONs) become increasingly faster, it becomes increasingly more important for the tunable element to be tuned at a high speed. At the same time, while it is important to be able to tune the tunable element at a high speed, it is also necessary for the tuning to be precise and accurate in order to minimize attenuation of the desired downstream or upstream signal (e.g., as it passes through the cable or filter). In other words, it is desirable to both rapidly and precisely change a temperature of the tunable element. It is further desirable for the optical device to have a relatively compact size, and to minimize the cost of the temperature control components, as well as the cost of their installation.

It is generally known that a thermoelectric cooler (TEC) may be used to stabilize the temperature of an optical device in order to stabilize the wavelength of the upstream or filtered downstream optical signal. However, the TEC changes the temperature of the device at a relatively slow rate. The TEC would need to be able to change the temperature of the tunable element at a faster rate in order to be a suitable tuning mechanism.

In the case of a laser that is operated in burst-mode, it is also generally known that a heater may be used to stabilize the temperature of the laser, thereby stabilizing the wavelength of the light emitted from the laser. Without temperature stabilization achieved by the heater, the wavelength of light emitted from the laser could drift due to temperature fluctuations in the laser caused by the abrupt transitions between on (emitting light) and off (not emitting light) modes. Generally, the heater is used to keep the laser warm while it is off so that there is no temperature fluctuation when the laser is turned on. However, operating the heater in an efficient manner is challenging. It is only necessary for the laser to be kept warm just before it is turned on; therefore, it is not necessary to operate the heater the entire time the laser is off. But because of the unpredictable nature of status transitions when operating the laser in burst-mode, it is not known when the laser will turn on. Additionally, the amount of time for which the laser is off varies from cycle to cycle, making the amount of time and energy needed to warm the laser inconsistent as well.

BRIEF SUMMARY OF THE INVENTION

The present disclosure is directed to various embodiments of optical devices, optical control systems, and methods that provide for fast, accurate and stable tuning of an optical signal. This is accomplished by providing at least two temperature control devices in the optical device. A first temperature control device may be used to maintain the overall temperature of the device within a temperature range over which the device may reasonably operate. A second temperature control device may be used to control the temperature of a focused region of the optical device, the focused region including the tunable element. Because the second temperature device is confined to the focused region, it is able to change the temperature of the focused region much more quickly than the first temperature control device can change the overall temperature of the device. In this manner, the first temperature control device provides coarse temperature control over a relatively wide range of temperatures across a relatively wide space, whereas the second temperature control device provides fine temperature control over a relatively narrower range of temperatures in a relatively narrow space.

The first and second temperature control devices may also be thought of as providing dual stage temperature control, with the first temperature control device being responsible for keeping the device "close" to the desired temperature of the tunable element, and the second temperature control device being responsible for adjusting the precise temperature of the tunable element in order to facilitate operation of the optical device (and reduce attenuation of the optical signal).

In the case of a laser operating in burst-mode, a time delay can be implemented between a burst-mode switch signal and the laser turning on in order to provide sufficient time to heat the laser to or close to its normal operating temperature. During the delay, a third temperature control device may be used to heat the laser. The magnitude and duration of the electric current provided by the temperature control device to heat the laser may vary from cycle to cycle, depending on the previous on and off times of the burst-mode switch signal. Stated another way, the third temperature control device may be thought of as a heater, and the temperature of the heater and how long it is kept on may vary as a function of how long the laser was previously off.

One aspect of the present disclosure is directed to an optical device including at least one temperature-dependent tunable element for controlling a wavelength of an optical signal, a first temperature control circuit for controlling a temperature of a first region of the optical device, and a second temperature control circuit for controlling a temperature of a second region of the optical device. The tunable element may be one of (i) a laser for transmitting an outgoing optical signal and (ii) an optical filter coupled to a photodetector for receiving an incoming optical signal. The second region may include a portion of the first region. The second region may be smaller than the first region. The tunable element may be positioned in the second region such that a temperature of the tunable element is controlled based on the second temperature control circuit controlling the temperature of the second region.

In some examples, at least one of the first and second temperature control circuits may be a thermoelectric cooler, or a thin film heater. The second temperature control circuit may be configured to control the temperature of the tunable element across a range of at least 24° C.

For those devices that include a laser, the laser may be configured to transmit an optical signal at any of at least four different wavelengths, and the wavelength of the optical signal transmitted by the laser may be based on the temperature of the laser. In some examples, the device may be an optical transceiver, meaning that it includes each of the laser, the photodetector, and the optical filter. Optical transceivers may be configured to perform one of wavelength-division multiplexing (WDM), dense wavelength-division multiplexing (DWDM), and coarse wavelength-division multiplexing (CWDM), or other kinds of WDM.

In some examples, the second region may be defined by a housing, and the second temperature control circuit may be configured to control the temperature inside the housing. If the first temperature control device is communicatively coupled to the second temperature control device, it may be operable to provide an indication of the temperature of the first region to the second temperature control device. The second temperature control device may then be configured to control the temperature of the second region based on the indication of the temperature of the first region.

In some examples, the optical device may further include a control circuit configured to receive an indication of an ambient temperature at the optical device's location, and to control the respective temperatures of the first and second regions with respect to each other based on the indication of the ambient temperature.

In some examples, the second temperature control device may be configured to heat the tunable element. In such examples, the first temperature control device may be configured to maintain the first region at a temperature lower than the second temperature control device maintains the second region, whereby when the second temperature control device is off, the tunable element may be cooled, and when the second temperature control device is on, the tunable element may be heated. Additionally or alternatively, the second temperature device may be configured to adjust the temperature of the second region at a faster rate than the first temperature device is configured to adjust the temperature of the first region.

Another aspect of the present disclosure is directed to a control system, such as a controller or control circuit, included in a device having at least one of (i) a tunable optical transmitter configured to selectively generate a first optical signal at one of a plurality of preselected wavelengths or (ii) an optical receiver coupled to a tunable optical bandpass filter configured to selectively pass a second optical signal at one of a plurality of preselected wavelengths. The control system may be configured to receive one or more temperature-indicative measurements from one or more corresponding sensors, transmit a first control signal to a first temperature control circuit to control a temperature of the device based on one of the received temperature-indicative measurements, and transmit a second control signal to a second temperature control circuit to control a temperature of the tunable optical transmitter or the tunable optical bandpass filter based on one of the received temperature-indicative measurements.

In some examples, the control system may include a first control circuit coupled to a first sensor that senses an ambient temperature at a location of the device, and a second control circuit coupled to a second sensor that senses a property indicative of a temperature of the tunable optical transmitter or the tunable optical bandpass filter. The first control signal may be based on a first temperature measurement of the first temperature sensor, and the second control signal may be based on the property sensed by the second sensor. If the control system is coupled to a single sensor and to both the first and second temperature control circuits, it may be configured to provide the same control signal to both the first and second temperature control circuits based on the measurement of the single sensor. In some instances, the second control signal may be based further on the first control signal. Also in some instances, the control system may be configured to control the temperature of the tunable optical transmitter or the tunable optical bandpass filter across a range of at least 24° C.

In some examples, the device may include each of the tunable optical transmitter, the optical receiver, and the optical bandpass filter coupled to the receiver, and the second control signal may control the temperature of the optical transmitter and the optical bandpass filter based on at least one of the received temperature-indicative measurements.

Yet a further aspect of the present disclosure is directed to a method for controlling a device having at least one of (i) a tunable optical transmitter configured to selectively generate a first optical signal at one of a plurality of preselected wavelengths or (ii) an optical receiver coupled to a tunable optical bandpass filter configured to selectively pass a second optical signal at one of a plurality of preselected wavelengths. The method may involve: receiving one or more temperature-indicative measurements from one or more corresponding sensors; transmitting a first control signal to a first temperature control circuit to control a temperature of the device based on one of the received temperature-indicative measurements; and transmitting a second control signal to a second temperature control circuit to control a temperature of the tunable optical transmitter or the tunable optical bandpass filter based on one of the received temperature-indicative measurements.

An even further aspect of the present disclosure is directed to each of a control circuit and method for regulating a temperature of an optical device that emits an optical signal at an operating wavelength, the temperature of the optical device affecting the operating wavelength of the optical signal. The control circuit receives from a burst-mode switch: a first signal indicating the burst-mode switch switching from a first state to a second state, and a second signal indicating the burst-mode switch switching from the second state to the first state. The control circuit further controls a power source to provide electric current to a heating element based on the first and second signals beginning at or after the control circuit receives the second signal and ending at or after the second signal causes the optical device to emit an optical signal. The electrical current provided to the heating element causes the temperature of the optical device to increase. The electrical current provided to the heating element may reduce fluctuations of the operating wavelength of the optical signal emitted by the optical device. In some instances, the optical device may be included in a time-division multiplexing passive optical network, and may receive the first and second signals from the burst-mode switch within a 125 microsecond window.

In some examples, the system includes a current source configured to generate the electric current provided to the heating element. The control circuit may be configured to control operation of the current source as a function of a time elapsed while the burst-mode switch signal is in the second state. For instance, the control circuit may be configured to control a magnitude of the electric current provided to the heating element as a function of a time elapsed while the burst-mode switch signal is in the second state. For further instance, the control circuit may be configured to control a duration of the electric current provided to the heating element as a function of a time elapsed while the burst-mode switch signal is in the second state.

Yet a further aspect of the present disclosure is directed to a system for regulating a temperature of an optical device that emits an optical signal at an operating wavelength, the temperature of the optical device affecting the operating wavelength of the optical signal. The system may include a control unit and a time delay circuit. The control unit may be configured to receive a burst-mode switch signal for which switching from a first state to a second state causes the optical device to stop emitting the optical signal, and switching from the second state to the first state causes the optical device to begin emitting the optical signal. The time delay circuit may create a time delay between (i) the burst-mode switch signal switching from the second state to the first state and (ii) the optical device beginning to emit the optical signal. The control circuit may further be configured to determine an amount of time that the optical device is not emitting the optical signal based on the burst-mode switch signal, and control an electric current provided to the heating element for increasing the temperature of the optical device. The control circuit may be configured to control the electric current provided to the heating element only during the time delay. Increasing the temperature of the optical device may reduce fluctuations in the operating wavelength of the optical signal.

In some examples, the time delay circuit may be communicatively coupled to the control circuit, whereby the control circuit provides the burst-mode switch signal to the delay circuit. Also, in some examples, the heating element may be included in a packaging of the optical device, and the control circuit may be packaged separately from the heating element and coupled to the heating element by one or more wires. In some examples, the system may further include a burst-mode switch configured to provide the burst-mode switch signal.

In some examples, the power source may provide a non-zero electric current to the heating element between the first and second signals, and the control circuit may control the power source to increase the amount of current provided to the heating element based on the first and second signals. In some examples, the control circuit may control the power source to provide electric current to the heating element as a function of a time difference between the first and second signals. The control circuit may further control the power source to provide electric current to the heating element according to the function, whereby the function may provide for at least one of a magnitude and a duration of the electric current provided to the heating element to increase as the time difference between the first and second signals increases. The control circuit may control the power source to provide electric current to the heating element according to the function, wherein the function provides for zero electric current to be provided to the heating element when the time difference is less than a threshold value. The threshold value may be greater than the time between (i) the control circuit receiving the second signal and (ii) the second signal causing the optical device to emit an optical signal. In some examples, the time between (i) the control circuit receiving the second signal and (ii) the second signal causing the optical device to emit an optical signal may be a fixed amount of time.

DETAILED DESCRIPTION

Figure 1:
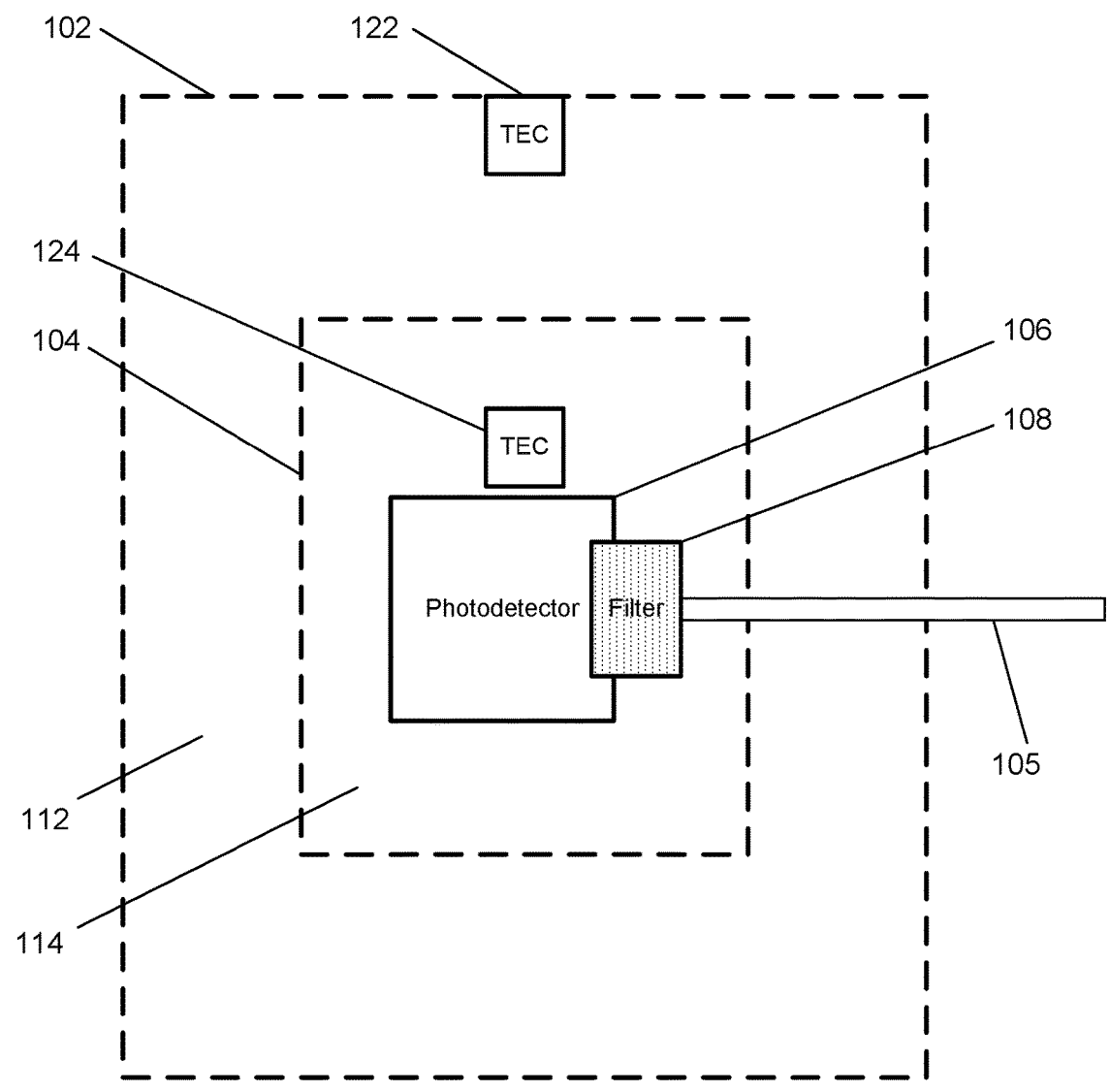
FIG. 1 is a block diagram of an optical device in accordance with an aspect of the present disclosure.

FIG. 1 shows a block diagram of an optical device 100 for receiving an optical signal at an optical signal receiver 106, such as a photodetector, from one or more optical network units over a cable 105, such as an optical fiber. The optical fiber may be, but is not limited to being made of glass fibers.

The optical signal is filtered by a tunable optical filter 108. The optical filter 108 may be a partially transmitting and partially reflecting optical filter, commonly known as a TAP filter. The optical filter may be, but is not limited to being, made of any one of glass, plastics such as polycarbonates or acrylics, or a multilayered thin film coating made of dielectric materials, such as $SiO_2$ and $TiO_2$. The optical filter 108 may be temperature-dependent, meaning that the temperature of the filter affects its operation. For example, if the filter is a bandpass filter, then the central wavelength passed by the filter may shift as the temperature of the filter changes. The correlation between filter temperature and central wavelength may be predefined based on the properties of the filter.

The optical device 100 further includes two temperature control devices. The temperature control devices may be, but are not limited to being, thermoelectric coolers or thin film heaters. One or both of the temperature control devices may be externally installed or embedded in the optical device. In some cases, one or both of the temperature control devices may be co-fabricated with the optical device, generally when the temperature control device is implemented for heating purposes only.

A first temperature control device 122 is positioned to provide temperature control of a first region 112 of the optical device 100. In the example of FIG. 1, the first region is defined by a first region boundary 102. In some instances, the first region 112 may be the portion of the optical device 100 that is housed inside of a casing, such that in FIG. 1 the casing is represented by the first region boundary 102. In other instances, the first region 102 may be a subset of a space within the casing of the optical device 100. In either case, the first temperature control device 122 may be positioned within the first region 112 or on the first region boundary 102.

A second temperature control device 124 is positioned to provide temperature control of a second region 114 of the optical device 100. The second region 114 may include a portion of the first region 112, such that the two regions at least partially overlap. The second region 114 may also be smaller than the first region 102, such that the second temperature control device 124 is responsible for cooling less space than is the first temperature control device 122. In the particular example of FIG. 1, the second region 114 is a subset of the first region 112. As with the first region 112, FIG. 1 illustrates the boundary of the second region 114 using by way of a second region boundary 104. Importantly, the optical filter 108 is positioned in the second region 114, such that controlling the temperature of the second region 114 also controls the temperature of the optical filter 108.

In some instances, the second region boundary 104 may include the space within a given radius of the second temperature control device 124. Thus, placing the second temperature control device 124 in close proximity (e.g., within said radius) to the optical filter ensures that the second temperature control device 124 may rapidly and accurately control the temperature of the filter 108 without having to affect the temperature of the entire first region 102 of the device 100. If the second temperature control device 124 is a TEC, then the second region 114 may further be defined by an orientation of the TEC, such that the second region extends in a direction in which the TEC faces.

Additionally or alternatively, the second region may be defined by a casing or housing that fully or partially encloses the optical filter 108. Such a casing may be useful for confining the effect of second temperature control device 124. Thus, placing the second temperature control device 124 on or within the casing also ensures that the second temperature control device 124 may rapidly and accurately control the temperature of the filter 108 without having to affect the temperature of the entire first region 102 of the device 100. In such instances, the casing may be represented by the second region boundary 104 of FIG. 1.

In the specific example of FIG. 1, the optical filter 108 is integrated with the photodetector 106 in a common housing, and a TEC 124 (provided as the second temperature control device) is positioned on or in close proximity to the common housing of the photodetector 106/optical filter 108. In this manner, the TEC 124 is responsible only for controlling the temperature of the photodetector (and the integrated filter), and not for controlling the overall temperature of the optical device 100.

Because the second temperature control device 124 is needed only for regulating temperature of the filter 108, the temperature range of the second temperature control device 124 may be relatively narrow compared to the temperature range of the first temperature control device 122. For instance, the optical device 100 may be configured to receive optical signals at any one of "n" predetermined channels, and the optical filter 108 may be configured such that a temperature change causes the center wavelength passed by the filter to shift about "x" nm per degree Celsius. Then, for a desired spacing of "y" nm between channels, it is necessary to control the temperature of the optical filter 108 across a range of $$\left[(n-1)\cdot\frac{y}{x}\right]° C.$$

In other instances, the control range of the second temperature control device 124 may be wider than that of the first temperature control device 122. Furthermore, the two temperature ranges may, but do not necessarily, overlap with one another. For instance, if the first temperature control device 122 is capable of heating and cooling, and the second temperature control device 124 is capable of heating only, then the first temperature control device 122 may heat and cool the overall device within a relatively narrow range of operational temperatures, and the second temperature control device 124 may heat the optical filter over a wider range of temperatures, all of which may be hotter than the suitable range of temperatures of the overall device. In such an instance, the first temperature control device 122 may be used to create a local heat sinking region at a relatively low temperature (e.g., if the ambient temperature is high) so that when the second temperature control device 124 is off, the optical filter 108 of the device 100 cools relatively fast due to a large temperature gradient within the device 100. Conversely, when the second temperature control device 124 is on, the optical filter 108 is heated relatively fast due to the heating of the second temperature control device 124.

For example, if a device receives optical signals at any one of four channels using wavelength division multiplexing (WDM) technology requiring 100 GHz (about 0.8 nm) spacing in optical frequency between channels, and if a temperature change causes the optical filter to shift 0.1 nm/° C., then the required temperature range of the second temperature control device 124 is about $$(4-1)\cdot\frac{0.8}{0.1}=24° C.$$

For further example, if the device uses dense wavelength division multiplexing (DWDM) technology requiring 50 GHz (about 0.4 nm) spacing in optical frequency between channels, then the required temperature range of the second temperature control device 124 would be about $$(4-1)\cdot\frac{0.4}{0.1}=12° C.$$

By contrast, the first temperature control device 122 is needed for regulating the overall temperature of the optical device 100 and isolating that temperature from its surrounding environment. The overall temperature of the optical device may be influenced by the ambient temperature of the device's surroundings, and the ambient temperature can vary by much more than 24° C. Keeping the temperature of the entire optical device 100 within the 24° C. range of operation of the filter 108 may require a significant amount of power. Instead, it is more efficient (both in terms of cost and energy) for the first temperature control device 122 to merely isolate the temperature of the entire optical device 100 from its environment, keeping it close to but not at the operational range of the optical filter 108. The presence of the first temperature control device 122 reduces the amount of power needed for the second temperature control device 124 to keep the temperature of the optical filter 108 within its operational range. The presence of the first temperature control device 122 also reduces the temperature gradient between the first region 112 and second region 114 of the optical device 100, thereby improving the second temperature control device's ability to rapidly control the temperature in the second region 112.

Figure 2:
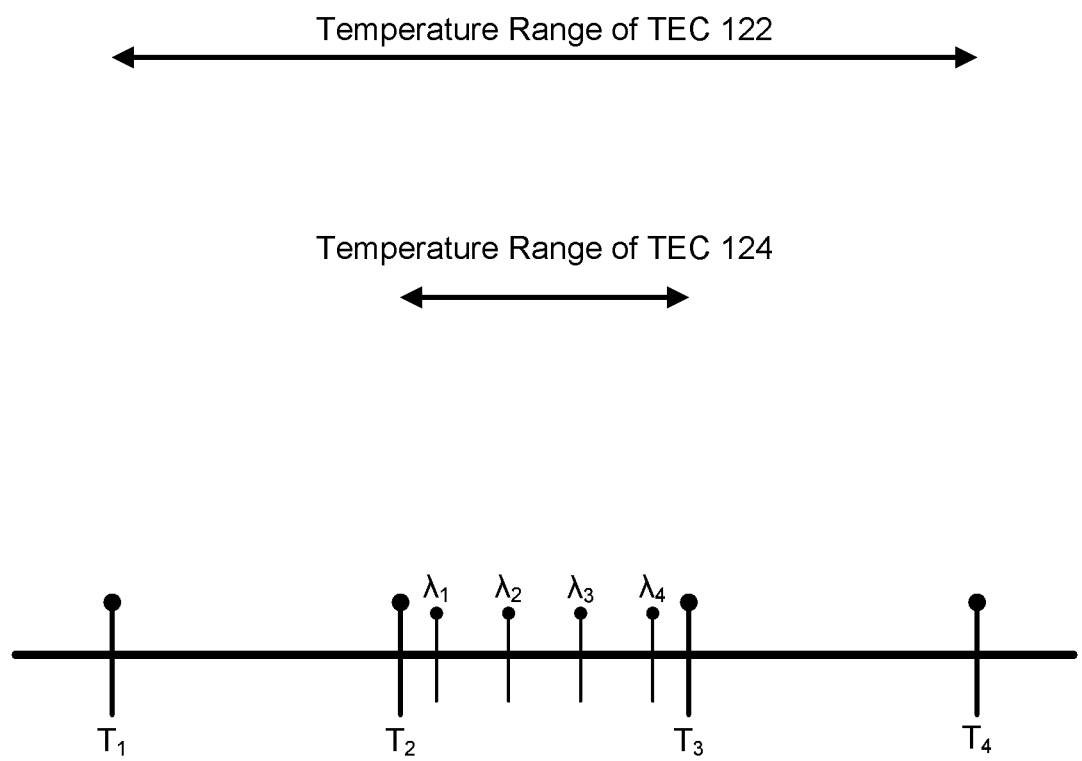
FIG. 2 is a plot illustrating a temperature range of the optical device of FIG. 1.

Altogether, the operational temperature range of the second temperature control device may be relatively narrow compared to the operational temperature range of the first temperature control device. By way of example, FIG. 2 illustrates an example in which the relative temperature ranges of first and second temperature control devices, such as those shown in FIG. 1, and in which the range of the second temperature control device is subsumed within the range of the first temperature control device. As shown in FIG. 2, the temperature range of the first temperature control device 122 is from $T_1$ to $T_4$, whereas the temperature range of the second temperature control device 124 is from $T_2$ to $T_3$, for which $T_1 < T_2 < T_3 < T_4$.

Many optical devices are designed to operate within a range of temperatures from −40° C. to 85° C. The temperature range between $T_1$ and $T_4$ may extend across the full range of operational temperatures, but in many cases may be limited due to factors such as power consumption, thermal mechanical design, and temperature control device specifications. In one example optical device, the temperature range between $T_2$ and $T_3$ may be about 24° C. or 25° C. Such a temperature range may be suitable for a second temperature control device even when the second temperature control device performs heating only, and the temperature range of the first temperature control device is narrower and does not overlap with that of the second temperature control device.

FIG. 2 also illustrates four predetermined wavelengths $\lambda_1$, $\lambda_2$, $\lambda_3$ and $\lambda_4$ or channels at which the optical device photodetector is configured to receive an optical signal. These wavelengths are plotted against the range of temperatures since there is a one-to-one relationship between a given temperature and the wavelength passed by the filter at that temperature. The second temperature control device 124 is configured to selectively adjust the temperature of the filter to any one of the temperatures corresponding to the predetermined wavelengths $\lambda_1, \lambda_2, \lambda_3$ and $\lambda_4$. Therefore, temperatures $T_2$ and $T_3$ must be selected such that each of the predetermined wavelengths necessarily corresponds to a temperature between $T_2$ and $T_3$ ($T_2 < T(\lambda_1) < T(\lambda_2) < T(\lambda_3) < T(\lambda_4) < T_3$).

In the example of FIG. 2, the predetermined wavelengths are equally spaced. However, in examples involving other optical devices, the predetermined wavelengths may be spaced unevenly, provided that the wavelengths are spaced apart by at least a threshold minimum.

Figure 3:
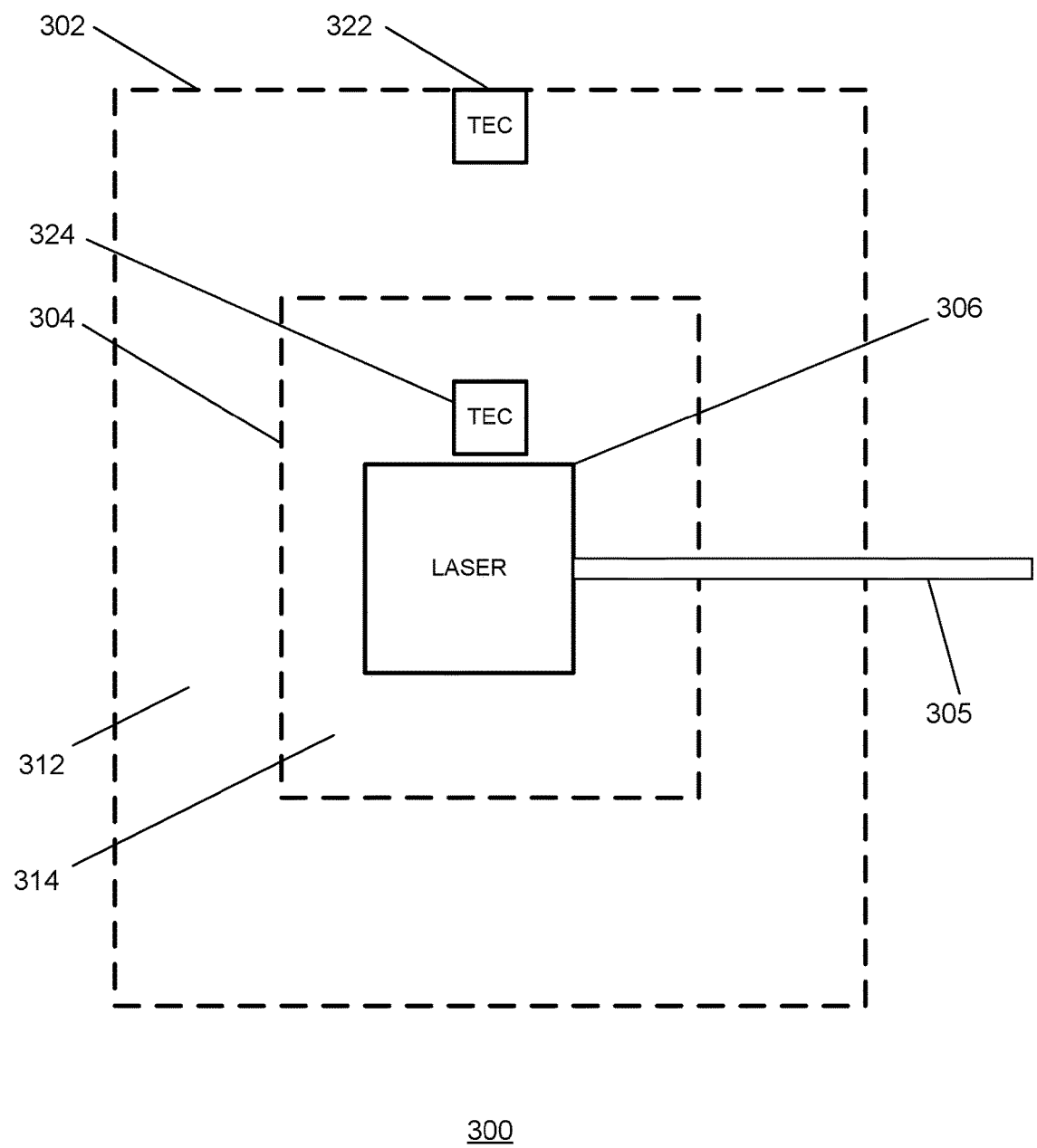
FIG. 3 is a block diagram of another optical device in accordance with an aspect of the present disclosure.

The example of FIG. 1 illustrates an optical device with a temperature dependent receiver. However, the same concepts may apply to a temperature dependent transmitter. For example, FIG. 3 is a block diagram of another optical device 300 for generating and transmitting an optical signal from an optical signal generator 306 or transmitter, such as a laser, to one to or more optical network units over a cable 305, such as an optical fiber. As in FIG. 1, the optical fiber of FIG. 3 may be, but is not limited to being, made of glass fibers.

The optical signal generator 306 may be temperature-dependent, meaning that its temperature affects its operation. For example, in the case of a laser, the temperature of the laser affects the wavelength of light outputted by the laser. The correlation between laser temperature and wavelength may be predefined based on the properties of the laser.

The optical device 300 of FIG. 3 includes two temperature control devices, which may be compared to the above-described temperature control devices of FIG. 1. The first temperature control device 322 is positioned so as to control the temperature of a first region 312 defined in FIG. 3 by boundary 302. The second temperature control device 324 is positioned so as to control the temperature of the second region 314 defined in FIG. 3 by boundary 304. The first and second boundaries may be physical boundaries of the device 300 (e.g., a housing of the device 300, a casing at least partially surrounding the laser 306, etc.) non-physical boundaries representative of the space controlled by the respective temperature control devices. As described above, the second region 314 may partially overlap with the first region 312 or may be subsumed within the first region 312. The second region 314 may also be smaller than the first region 312. Additionally, in order to cause relatively fast temperature control of the optical signal generator 306, the optical signal generator is positioned in the second region 314.

Similar to the filter described above in connection with FIGS. 1 and 2, the optical signal generator 306 may be configured to emit an optical signal at one of any plurality of predetermined wavelengths (e.g., 4 wavelengths). Each of those wavelengths may correspond to a predefined temperature, and the second temperature control device 324 may be configured to adjust the temperature of the optical signal generator 306 to correspond with a desired output wavelength. Thus, the second temperature control device 324 may be configured to control the temperature of the optical signal generator 324 within a range of temperatures that includes the temperatures corresponding to each of the plurality of predetermined wavelengths. This range of temperatures may be narrower than the operational range of the first temperature control device 322.

The temperature control devices described above may be operated using one or more controllers. The one or more controllers may be integrated with one or both of the temperature control devices. Additionally or alternatively, the controller(s) may be integrated with the optical device apart from the temperature control devices. Additionally or alternatively, the controller(s) may be standalone devices communicatively coupled to the optical device and temperature control devices.

Figure 4:
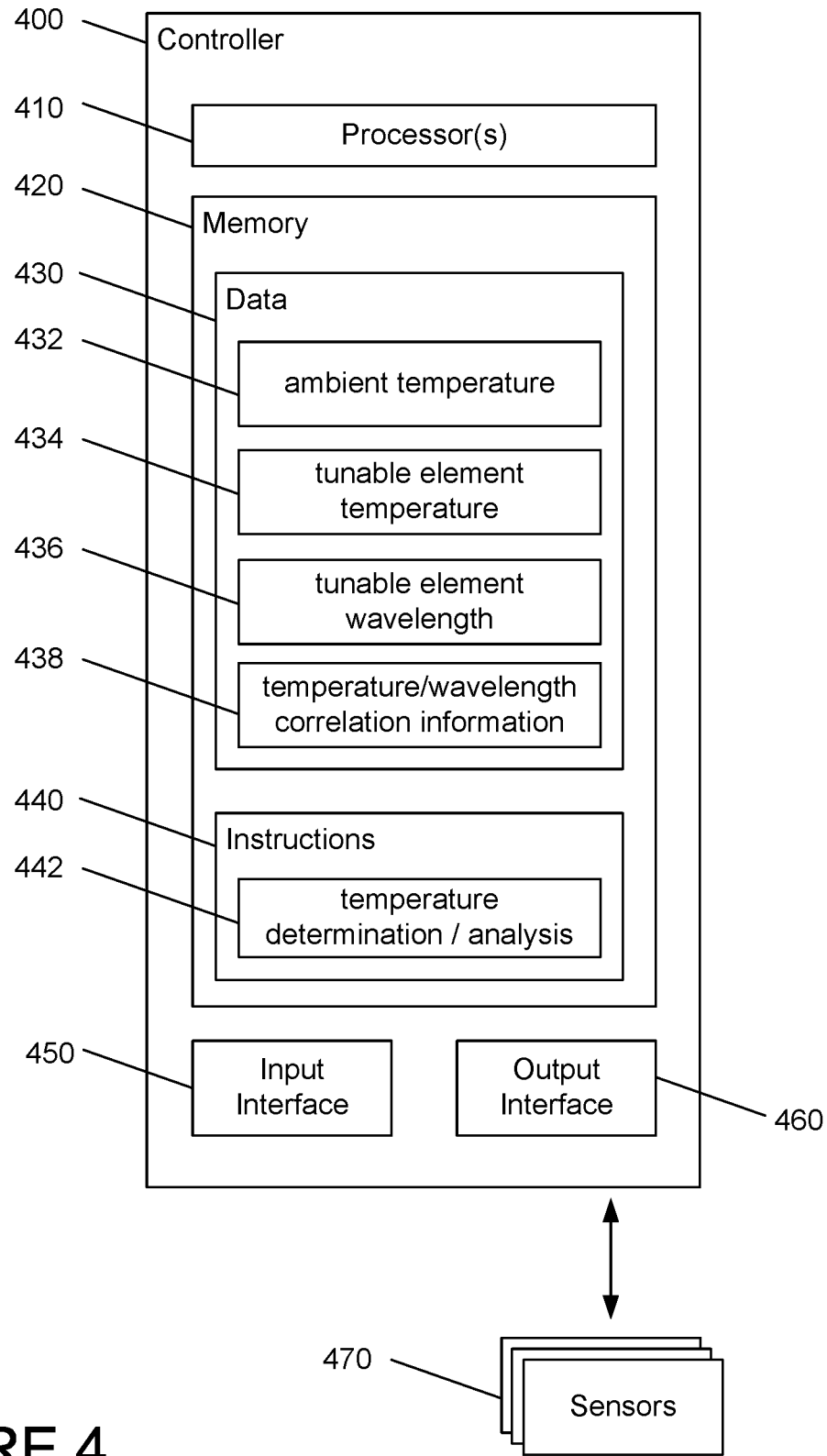
FIG. 4 is a block diagram of a controller of an optical device in accordance with an aspect of the present disclosure.

FIG. 4 is a block diagram of an example controller 400. The controller(s) may include one or more processors 410 (e.g., central processing units, application-specific integrated circuits, field programmable gate arrays, etc.), memory 420 (e.g., hard-drive, ROM, RAM, CD-ROM, write-capable, read-only, etc.) storing both data 430 and instructions 440, an input interface 450 for receiving data, and an output interface 460 for transmitting instructions and optionally data.

While one processor block is shown, the controller 400 may also include multiple processors which may or may not operate in parallel. The processor 410 may carry out programmed instructions stored in the memory 420.

The stored data 430 may include temperature measurements, such as an ambient temperature of the device's surroundings 432, or a temperature of the temperature-dependent tunable element of the device 434 (e.g., an optical filter, an optical signal generator). The temperature measurements may be received by the controller via the input interface. In some instances, the temperature measurements may be collected from one or more temperature sensors 470 coupled to the controller 400. For instance, the one or more sensors may include a temperature sensor configured to sense a temperature of the optical filter. The temperature sensor may be, but is not limited to being, a resistive temperature sensor such as Negative Temperature Coefficient (NTC) thermistor or Positive Temperature Coefficient (PTC) thermistor. In such instances, the controller 400 may receive a measurement of the temperature 434 from the temperature sensor.

Alternatively, the temperature of the tunable element may be determined using the wavelength of the optical signal. For example, the wavelength of light passed through an optical filter may be indicative of the filter's temperature. Similarly, the wavelength of light generated by a laser may be indicative of the laser's temperature. In such instances, the controller 400 may receive a measurement of the passed/generated wavelength 436, and determine the tunable element's temperature based on the received measurement. The wavelength measurement may be received from a wavelength meter or spectrum analyzer at the input interface of the controller.

The stored data may further include correlation information 438 (such as a data table) correlating given optical signal wavelengths with corresponding temperatures for the tunable element in order to properly set the temperature control devices to the appropriate temperatures corresponding to a desired wavelength. In the case of an optical device including a wavelength sensor, the correlation information may also be used to correspond the wavelength measurements to temperature in order to measure temperature based on wavelength.

Alternatively or additionally, in the case of a tunable optical filter, the wavelength passed through the filter may be measured using a photodetector connected to an output end of the filter. Since it is known that the downstream optical signal received is to be received at one of four predetermined wavelengths, if the optical filter is centered close to but not at one of those predetermined wavelengths, the deviations in the center wavelength of the filter may result in attenuation of the received optical signal. The photodetector may detect this attenuation if the magnitude of the optical signal is below a preset threshold, or drops by a predetermined threshold amount. Thus, current measurements of the photodetector could be used to monitor the center wavelength of the filter, and the controller could instruct the second temperature control device to adjust the filter temperature to correct the sensed deviation in central wavelength. Optical devices having a temperature control based on current measurement are described in greater detail in the commonly owned priority application Ser. No. 62/507,283, the disclosure of which is hereby incorporated in its entirety herein.

Sensors 470 (e.g., temperature sensors, wavelength sensors, photodetectors) are not shown in FIGS. 1 and 3, but it will be understood that they may be placed anywhere within or around the device such that they are capable of collecting the above specified measurements.

Using the one or more processors, the controller(s) may analyze 442 the received temperature data and determine a desired temperature for each of the first and second temperature control devices based on the analysis. The determined temperatures are then communicated to the temperature control devices via the output interface 460.

Figure 5:
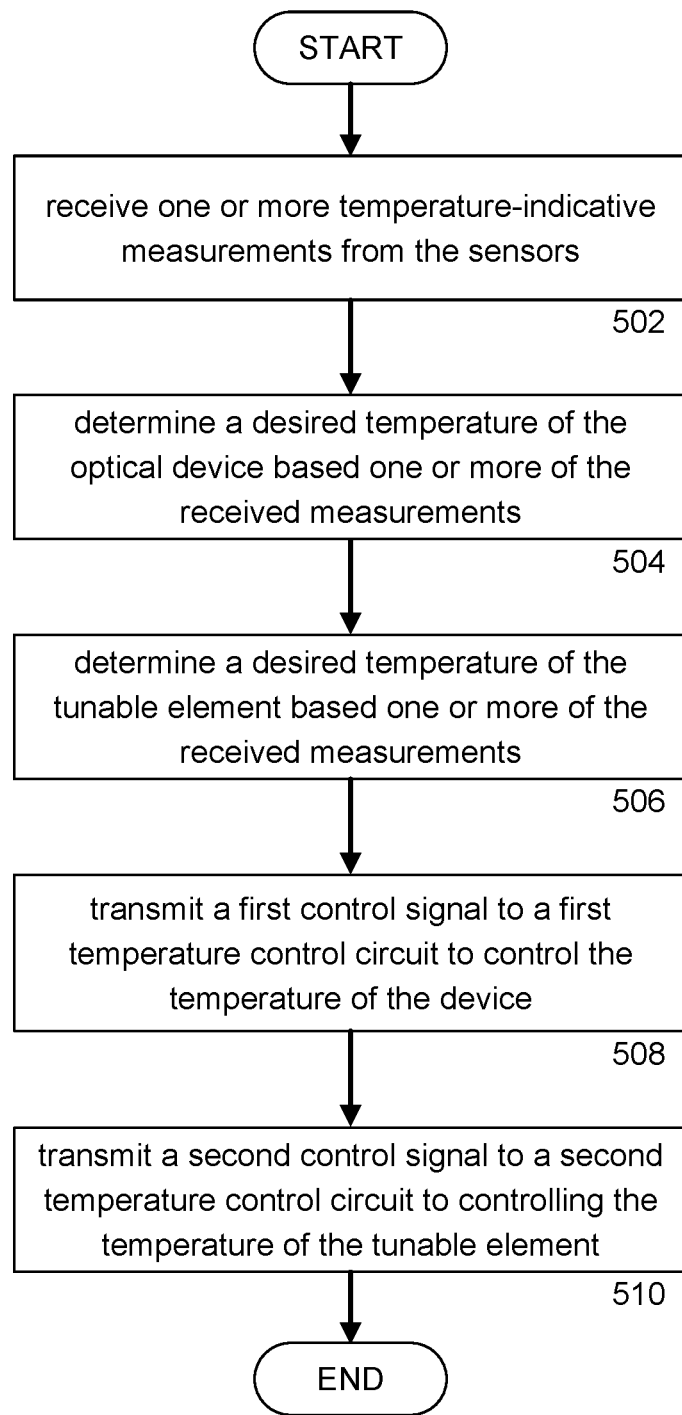
FIG. 5 is a flow diagram of a method in accordance with an aspect of the present disclosure.

FIG. 5 is a flow diagram illustrating an example routine 500 by which a controller may perform the above described operations. It should be understood that the operations of the example routine 500 do not have to be performed in the precise order described below. Rather, various operations can be handled in a different order, or simultaneously. Moreover, operations may be added or omitted.

At 502, the controller receives one or more temperature-indicative measurements from the sensors. As noted above, a temperature-indicative measurement may be direct measurements of temperature, or other measurements that are indicative of temperature (e.g., wavelength). In the same manner, the sensors may sense either temperature or other information that is indicative of temperature (e.g., wavelength). In some instances, the controller(s) may receive more than one temperature measurement.

At 504, the controller determines a desired temperature of the optical device based on one or more of the received measurements. This temperature may be based on an ambient temperature of the device's surroundings, and may be chosen to effectively isolate, temperature-wise, the device from its surroundings.

At 506, the controller determines a desired temperature of the tunable element (e.g., filter, laser) based on one or more of the received measurements. The desired temperature may be determined based on a correlation with a selected wavelength or channel of the tunable element (e.g., selected by a user), which may be received by the controller(s) via the input interface. In other words, the controller may determine the temperature of the tunable element required for the optical device to operate at the selected channel.

At 508, the controller transmits a first control signal to a first temperature control device via the output interface. The first control signal may instruct the first temperature control device to control, maintain or otherwise regulate the temperature of the device.

At 510, the controller transmits a second control signal to a second temperature control device via the output interface. The second control signal may instruct the second temperature control device to control, maintain or otherwise regulate the temperature of the tunable element.

While FIG. 5 generally describes a routine executed by a single controller, the same or similar routines may be executed using a plurality of controllers. For example, each of the first and second temperature control devices may be instructed by separate controllers.

Figure 6A:
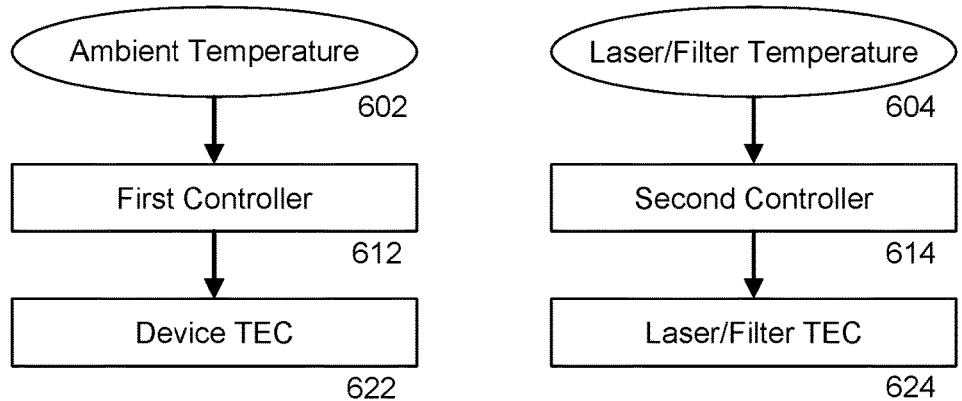
FIGS. 6A, 6B and 6C are functional block diagrams of various example control systems in accordance with aspects of the present disclosure.

FIG. 6A is a block diagram illustrating one example control scheme using separate controllers 612, 614 to control each of a first temperature control device (Device TEC 622) and a second temperature control device (Laser/Filter TEC 624). In the example of FIG. 6A, the first controller 612 receives an input from an ambient temperature sensor 602, determines a desired temperature of the device based on the input, and transmits an instruction to the device TEC 622 based on the determination. The second controller 614 receives an input from a tunable element (e.g., laser, filter)

temperature sensor 604, and transmits an instruction to the TEC 624 for the tunable element based on the determination. As explained above, the tunable element temperature sensor 604 may sense something indicative of temperature (e.g., wavelength) instead of temperature itself in order to monitor operation of the tunable element.

It should be noted that the desired temperature of the tunable element is based not on the element's temperature but rather on an instruction selecting a channel of the tunable element. Nonetheless, the controller may use the temperature information in order to determine how to adjust the TEC 624 to properly control the tunable element's temperature. In other words, if the tunable element must be set to a wavelength corresponding to 15° C., it is necessary to know the current temperature of the tunable element in order to know whether to heat the element, cool the element, or maintain it at its current temperature.

Figure 6B:
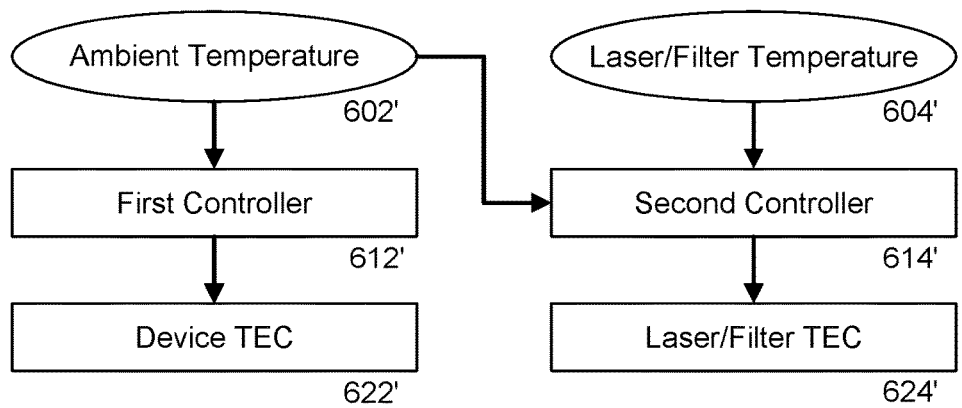

In alternative control schemes, at least one of the controllers may receive some or all of the information received by the other controller. FIG. 6B is a block diagram illustrating an example control scheme in which the second controller 614' receives from the temperature sensor 602' the same ambient temperature information as the first controller 612', in addition to the tunable element temperature information 604'. The first and second controllers may then use the ambient temperature information to coordinate the control scheme between the two TECs 622' and 624'. Coordinating the control scheme may allow for the controllers to optimize power use of the two TECs, thereby increasing efficiency and potentially reducing cost).

Figure 6C:
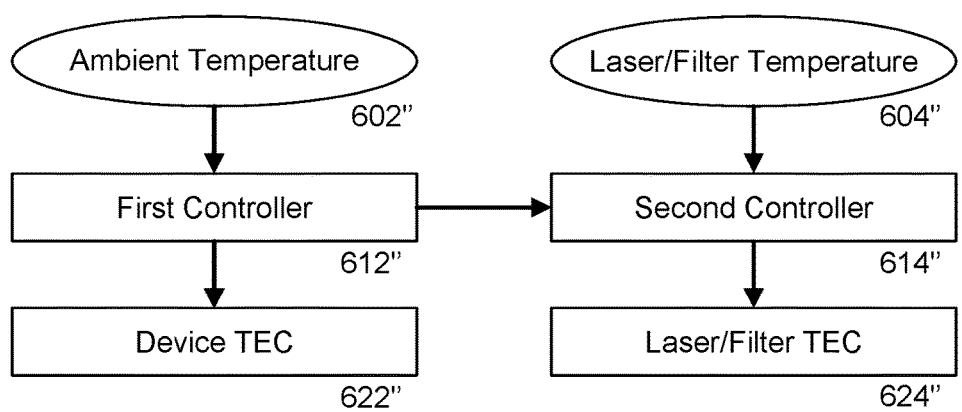

FIG. 6C is a block diagram illustrating a similar scheme as in FIG. 6B, except that in FIG. 6C the second controller 614" receives information from both the first controller 612" and the laser/filter temperature sensor 604". In this manner, the first controller may send instructions to the second controller 614", thereby coordinating with the second controller 614" more directly. In other words, the control scheme of FIG. 6C utilizes a master/slave relationship between the two controllers. The master controller 612" then controls the device TEC 622" based on information from the ambient temperature sensor 622", and the slave controller 614" controls the laser/filter TEC 624" based on either or both of the master controller's instructions and the temperature information from the laser/filter temperature sensor 604".

In yet further configurations, one of the two controllers may receive information from both sensors, and send instructions to the other of the two controllers. In yet further configurations, the two controllers may receive different information and then share the information over a bidirectional communication connection. One or both of the controllers may then determine instructions for controlling the TECs, and those instructions may be relayed through the controllers to be transmitted to the respective TECs.

Figure 7:
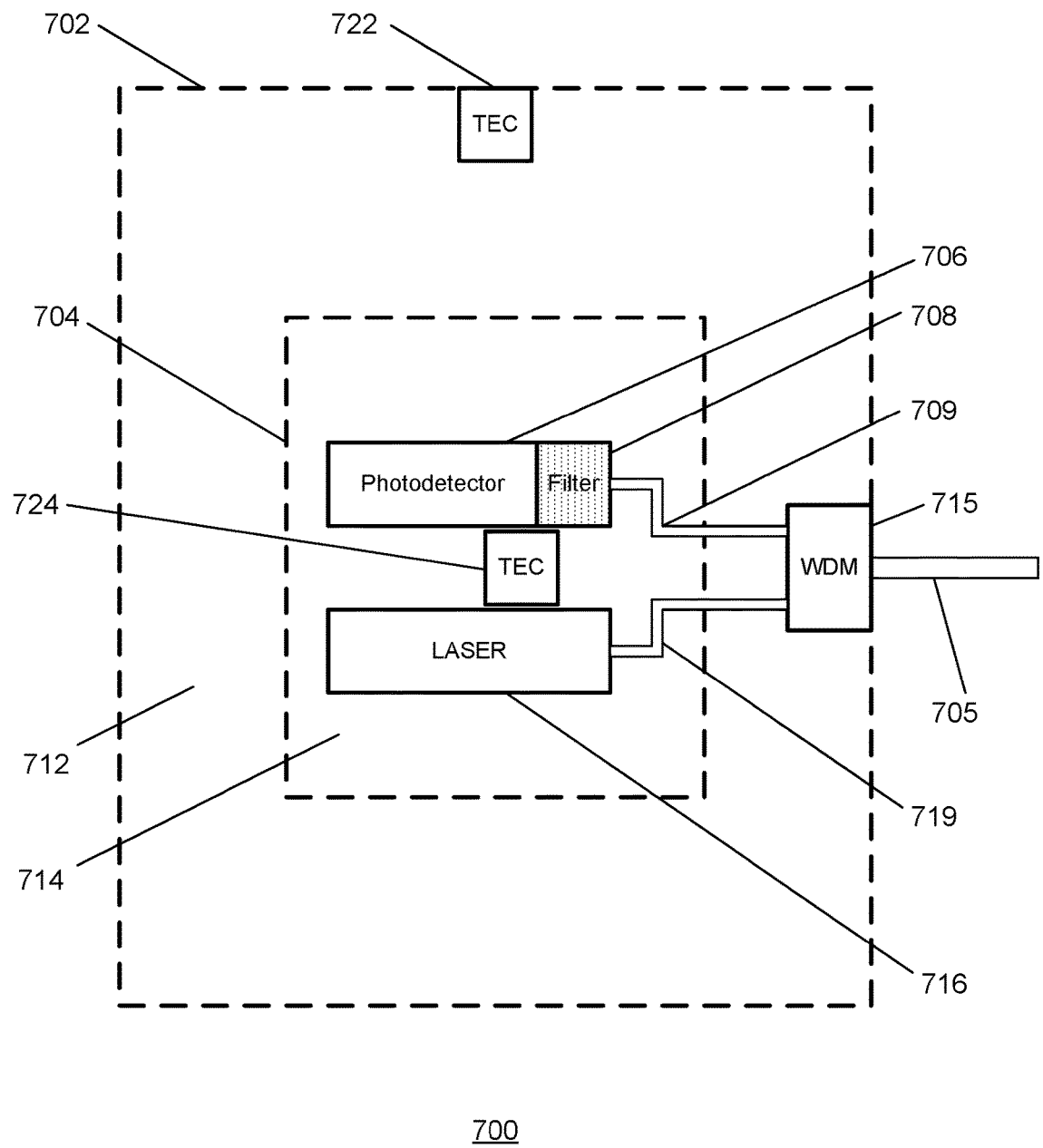
FIG. 7 is a block diagram of yet another optical device in accordance with an aspect of the present disclosure.

The above example devices, methods, and control systems illustrate temperature control in an optical device that either sends or receives optical signals. However, it should be recognized that the same principles may be applied to an optical transceiver that performs both transmitting and receiving optical signals. FIG. 7 is a block diagram of an optical transceiver device 700 including a photodetector 706, a laser 716 and a WDM 715 for controlling the transmission of optical signals to and from the photodetector and laser. The optical signals may be transmitted over cable 705 bi-directionally between the device 700 and one or more ONUs. The WDM may be any one of a coarse WDM, a dense WDM, or other WDM device for controlling a bidirectional stream of optical signals. The WDM is connected to the photodetector 706 via cable 709 and to the laser via cable 719, which, like cable 705, may be fiber optical cables. Positioned between cable 709 and the photodetector 706 is an optical filter 708. The laser, photodetector and optical filter may be comparable to the corresponding components described above in connection with FIGS. 1 and 3. Additionally, the optical signal channels of the photodetector (e.g., $\lambda_1$, $\lambda_2$, $\lambda_3$ and $\lambda_4$) may be different from the optical signal channels of the laser (e.g., $\lambda_5$, $\lambda_6$, $\lambda_7$ and $\lambda_8$)

Like in FIGS. 1 and 3, the optical transceiver device 700 includes a pair of temperature control devices 722, 724 for controlling respective regions 712, 714 of the device, as defined by boundaries 702, 704 in FIG. 7, respectively. The operation and positioning of the temperature control devices 722, 724 has been described in connection with the above FIGS. 1-6.

In the example of FIG. 7, the second temperature control device 724 is positioned to control the temperature of either one of the optical filter or the laser, depending on whether the optical device is transmitting or receiving optical signals. In other examples, each of the photodetector and the laser may have its own corresponding temperature control device, such that the device includes a total of three temperature control devices. Additionally, each of the filter and laser may occupy separate regions, and may occupy those respective regions with their corresponding temperature control devices.

Figure 8:
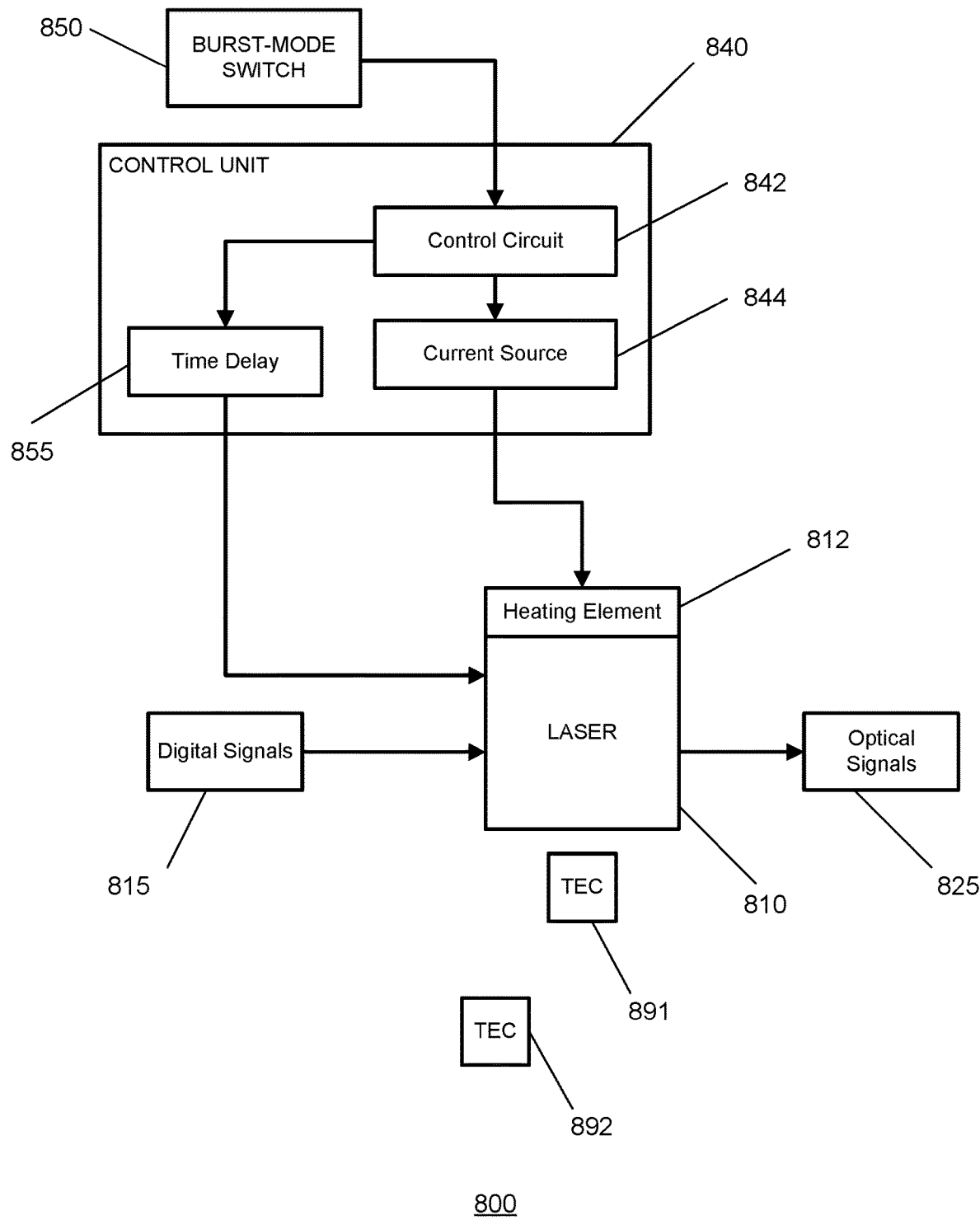
FIG. 8 is a block diagram of a further optical device in accordance with an aspect of the present disclosure.

Additionally or alternatively to the above-described temperature control devices and routines, in the case of a laser operating on a burst-mode transmission operation, a separate control circuit may be provided for regulating and stabilizing the temperature of the laser. FIG. 8 is a block diagram of an example system 800 for stabilizing the temperature of such a laser.

In the example of FIG. 8, a laser 810 receives information in the form of digital signals 815 and transmits the information in the form of optical signals 825. The laser 810 may be provided on a chip and included in a package (not shown), and may include a heating element 812 for regulating a temperature of the laser 810. The heating element 812 may be configured to convert an electrical current into heat, such as a resistor is configured to do. Since the laser 810 also generates heat when it is in operation, and since the operating wavelength of the laser 810 may depend on the temperature of the laser 810, in at least some instances, the laser 810 and heating element 812 can collectively be thought of as a heating element responsible for regulating the operating wavelength of the laser.

Transmission operations of the laser 810 are grouped in time-scale packets of a fixed duration. In a standard time-division multiplexing (TDM) passive optical network (PON) system, this fixed duration is commonly 125 microseconds. The optical signal is transmitted for only a portion of the fixed duration. The timing of the optical signal transmission—both in terms of when it begins and how long it lasts—varies from packet to packet. The laser 810 is in an ON state during the optical signal transmission, and returns to an OFF state once the transmission is complete, even if there is time remaining within the packet.

The laser is controlled at least in part by a temperature control unit 840. The temperature control unit may include a control circuit 842, such as one or more microcontrollers, for receiving input data indicating a state of the system 800, and a current source 844 or other power source for generating a controllable amount of electric current. The current source 844 may be adapted to provide the electric current to the heating element 812 in order to control a temperature of the laser 810. The electric current may be provided via one or more electrical wires. The example of FIG. 8 shows the heating element 812 as part of the laser 810 or mounted to the laser packaging. However, in other examples, the heating element 812 may be separate from the laser 810, and may even be included in the control unit 840. In yet further examples, both the control unit 840 and heating element 812 may be integrated with the laser packaging.

The system may further include a burst-mode switch 850 configured to provide burst-mode switch signaling which is used to control operation of the heating element 812 and the laser 810. The control circuit 842 of the temperature control unit 840 receives the signaling from the burst-mode switch 850, and uses the signaling to coordinate operations of the heating element 812 and laser 810 with one another. In operation, when the control circuit 842 determines an indication of burst mode turning off from the signaling of the burst-mode switch 850, the control circuit determines a profile for providing electric current from the current source 844 to the heating element 812, and instructs the current source 844 accordingly. Various electric current profiles are shown in the examples of FIG. 9C, as discussed below in greater detail.

The control circuit 842 also forwards the signaling to the laser 810, but via a time delay circuit 855 having a preset and fixed time delay. The time delay circuit allows for the heating element to respond to signaling of the burst-mode switch 850 prior to the laser 810 responding to the same signaling. In this respect, if the signaling instructs the laser 810 to turn on (e.g., a falling edge of the burst-mode switch signal), the delay provided by the delay circuit 855 gives the heating element 812 sufficient time to warm up the laser 810 before the laser 810 is turned on. The time delay is on the order of microseconds, and may vary depending on the particular application of the system 800.

Other temperature control devices 890, 891 for regional temperature regulation may be included in the system 800 as previously described in the present disclosure.

Figure 9A:
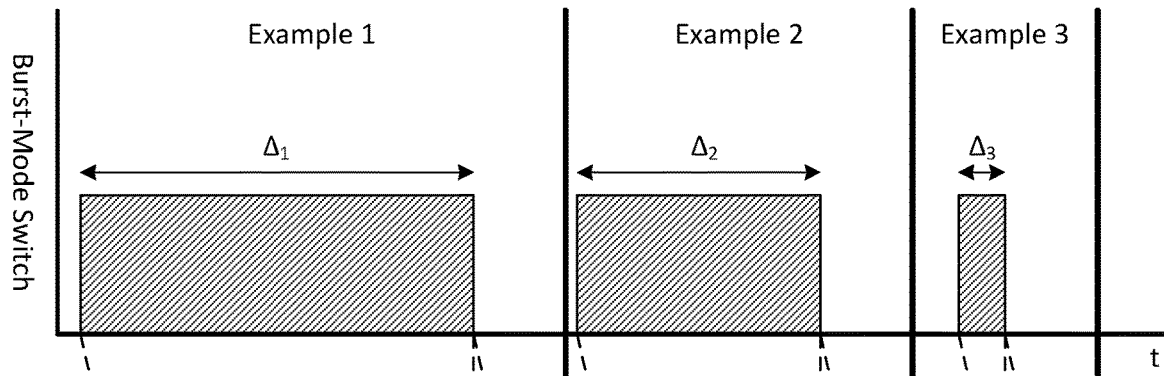
FIG. 9A is a plot illustrating a signal pattern of a burst-mode switch over time in accordance with an aspect of the present disclosure.
Figure 9B:
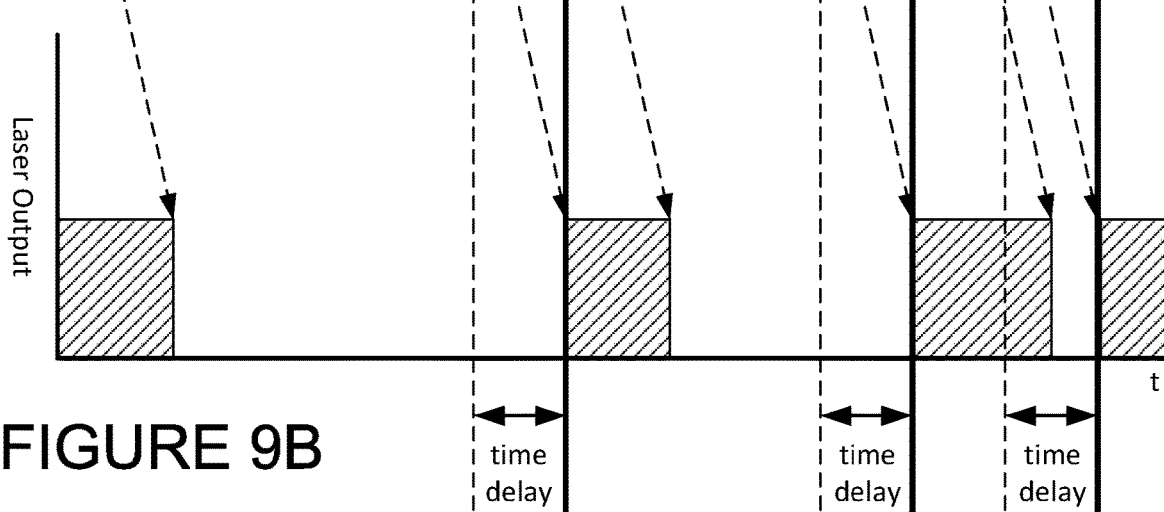
FIG. 9B is a plot illustrating a signal pattern of a laser emitting an optical signal over time in accordance with an aspect of the present disclosure.
Figure 9C:
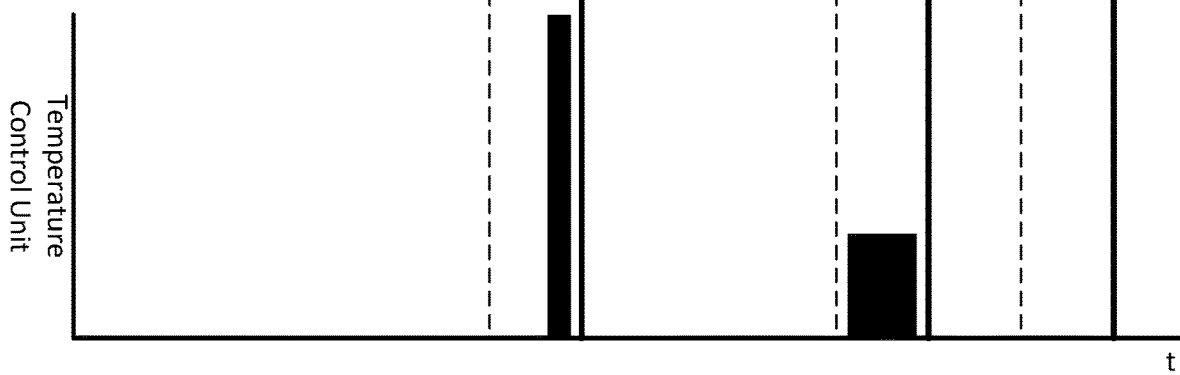
FIG. 9C is a plot illustrating current output of a temperature control unit over time in accordance with an aspect of the present disclosure.

Operation of the burst-mode switch 850, the laser 810, and the temperature control unit 840 are further shown in FIGS. 9A-9C, respectively. FIG. 9A shows the burst-mode switch 850 alternating between high and low states. FIG. 9B shows the laser 810 switching between high (on) and low (off) states. In the examples of FIGS. 9A and 9B: when the burst-mode switch 850 switches from the low state to the high state, the laser 810 turns off after a brief time delay; and when the burst-mode switch 850 switches from the high state to the low state, the laser 810 turns on after a brief time delay.

FIG. 9C shows electric current outputted by the temperature control unit 840. In the example FIG. 9C, the electric current is provided only during the time delay: after the temperature control unit 840 receives an indication that the burst-mode switch 850 has alternated from the high state to the low state; and before the laser 810 turns on.

The amount of current outputted by the temperature control unit 840 is determined based on information received from the burst-mode switch. FIGS. 9A-9C show three different examples of operation of the system 800 (Examples 1-3) in order to illustrate the factors involved in controlling the temperature of the laser 810.

In particular, a key factor to temperature control of the laser is the amount of time that the laser is off before turning back on. The amount of time that the laser is off differs in each of Examples 1-3, with the laser being off the longest amount of time in Example 1 and the shortest amount of time in Example 3. The temperature control unit 840 can determine how long the laser is off based on the burst-mode switch 850 signal. In particular, the time between the burst-mode switch rising edge (switching from low to high) and the burst-mode switch falling edge (switching from high to low) equals the time that the laser is off. Thus the determination by the temperature control unit is in part a measurement of how long the laser has been off since the last time the laser turned off, and also in part a predictive determination of how long the laser will continue to be off before the laser turns on.

In Example 1, the laser is off for a relatively long time, as indicated by the long time difference $\Delta_1$ between the rising edge and falling edge of the burst-mode switch signal. Because the laser has been off for a long time, the laser is colder than its normal temperature during operation, and if turned on abruptly without first being warmed, could exhibit a shift in operating wavelength. As a result, during the time delay, the temperature control unit applies an electric current to the heating element according to a first profile. In Example 1, the first profile has a duration of about one quarter of the time delay, and a relatively high magnitude, meaning that a lot of current is delivered to the heating element over a relatively short time. The first profile is designed to increase the temperature of the laser from its very low temperature to its normal operating temperature before the laser turns on.

In Example 2, the laser is off for a long time, but not as long of a time as in Example 1. This is indicated by the time difference $\Delta_2$ between the rising edge and falling edge of the burst-mode switch signal being shorter than the time difference $\Delta_2$ in Example 1. In Example 2, the laser is not as cold as compared to Example 1. Still, time difference $\Delta_2$ is long enough that if the laser were turned on abruptly without first being warmed, it could exhibit an unwanted shift in operating wavelength. As a result, during the time delay, the temperature control unit applies an electric current to the heating element according to a second profile. The second profile has a duration of about three quarters of the time delay, but a relatively low magnitude, meaning that a relatively low current is delivered to the heating element over a relatively long time. The second profile is designed to increase the temperature of the laser from its medium-low temperature to its normal operating temperature before the laser turns on.

In each of Examples 1 and 2, the temperature control unit cuts off the current supply at or before the time the laser turns on. Continuing to heat the laser after the laser turns on could be counterproductive to maintaining a stable temperature and operating wavelength, since the heating element could cause the temperature of the laser to increase above the laser's normal operating temperature. In addition, not heating the laser when the laser is operating may avoid unnecessary operation of the heating element for heating, and thus may conserve energy.

Next, in Example 3, the laser is off for a short time. This is indicated by the short time difference $\Delta_3$ between the rising edge and falling edge of the burst-mode switch signal. In fact, the time difference $\Delta_3$ in Example 3 is short enough (e.g., less than a predetermined threshold amount of time) that if the laser does not exhibit an unwanted shift in operating wavelength when turned on. As a result, there is no need to heat the laser during the time delay, and the temperature control unit applies no electric current to the heating element.

Particularly, in the case of Example 3, when the control circuit detects the falling edge of the burst-mode switch signal, the laser is still on due to the delayed response time between the previous rising edge of the burst-mode switch signal and the laser. However, even in other cases where the laser has already turned off before the control circuit detects the falling edge of the burst-mode switch signal, the control circuit may still determine not to apply an electric current to the heating element if the time difference $\Delta_3$ is short enough.

The above described electric current profiles are presented merely as examples. Those skilled in the art should understand that other electric current profiles may be provided. For instance, any shape waveform (e.g., sine wave, square wave, sawtooth wave, pulse train, etc.) may be used. The timing of when the wave begins and ends, and the amount of the time delay for which the wave lasts, may all be varied. Stated another way, the example profiles shown in FIGS. 9A-9C are intended merely as examples and are not intended to in any way limit the type of waveform or profile provided.

Additionally, in each of Examples 1-3 of FIG. 9C, no electrical current is provided to the heating element before the falling edge of the burst-mode signal. However, those skilled in the art will readily appreciate that the control circuit can begin controlling the amount and duration of current provided to the heating element after the falling edge regardless of whether any current is provided before the falling edge. In this regard, it is possible to provide a small amount of electric current to the heater at or after the laser turns off but before the burst-mode signal falling edge. In such an instance, the control circuit may determine, upon detecting the falling edge of the burst-mode signal, a change to the amount of current being provided to the heating element. The change in the current profile may be configured to sufficiently heat the laser to its operating temperature within the remaining time before the laser turns on, i.e., within the time delay. Therefore, for purposes of the present disclosure, it does not matter how much current is provided to the heating element before the burst-switch signal turns off, so long as there is a determination of a current waveform at or after the falling edge of the burst-mode signal, and so long as the determined current waveform ends at or before the laser turns on.

The above described operations of FIGS. 9A-9C show a time delay before both the laser turning on and turning off. However, those skilled in the art will readily appreciate that heating a laser before it turns on does not require a time delay before the laser turns off. As such, in other examples of the present disclosure, the time delay between the burst-mode switch and the laser may be provided only when the laser turns on, and not when the laser turns off. In such cases, the control circuit may differentiate between the burst-mode switch turning on or off, and may only delay operation of the laser in response to the burst-mode switch signaling when the burst-mode signal is determined to have turned off.

In will also be understood that the above examples of FIGS. 9A-9C apply when the control circuit has information about both a rising edge and falling edge on the burst-mode switch signal. However, when an optical device is first turned on, there may not be any burst-mode switch signal rising edge from which to measure an amount of time that the laser has been off. In such cases, an initializing routine may be used instead. Under the initializing routine, the control circuit may instruct the current source to generate electric current even before a falling edge of the burst-mode switch is detected.

Additionally, in the above examples of FIGS. 9A-9C, the laser is shown as turning on at a falling edge of the burst-mode switch signal, and turning off at a rising edge of the burst-mode switch signal. However, it will be readily appreciated that the laser can alternatively be programmed to turn off at the falling edge and on at the rising edge.

Lastly, the example system and routines of FIGS. 8 and 9A-9C are described in connection with a laser. However, those skilled in the art will appreciate that the same principles may be applied to any optical device for which the operating wavelength of the device changes with the device's temperature, and for which operation of the device causes a change in the device's temperature.

As described above, the optical devices, control systems and methods of the present disclosure may provide fast and efficient tuning for transmitting and/or receiving optical signals within a passive optical network (PON). For instance, these devices, systems and methods may be implemented in a modem connected to a PON. Furthermore, the devices, systems and methods described herein may be especially advantageous in a next-generation passive optical network (NG-PON), in which data is expected to be transmitted and received an order of magnitude faster (e.g., ten times faster) than the speed of an ordinary PON.

The above described optical devices, control systems and methods are also compatible with various aspects described in priority application Ser. No. 62,507,283. For instance, two feedback mechanisms may be provided to give feedback regarding the temperature of the laser or other tunable element of the optical device. One feedback mechanism may be used for coarse tuning (e.g., changing the desired optical signal channel). Coase tuning of the optical signal may be guided by indirect measurements of the signal, such as by measuring a temperature of a component of the device (e.g., an optical filter). Another feedback mechanism may be used to provide fine tuning (e.g., minimizing attenuation of the signal at or around the desired optical signal channel). Fine tuning of the optical signal may be guided by direct measurements of the signal, such as by measuring a magnitude of an electrical current of an electrical signal converted from the optical signal. Other aspects of priority application Ser. No. 62,507,283 may also be combined with the present disclosure to provide fast, accurate and stable tuning and locking of an optical signal.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An optical device comprising:
   at least one temperature-dependent tunable element for controlling a wavelength of an optical signal, wherein the tunable element is one of (i) a laser for transmitting an outgoing optical signal and (ii) an optical filter coupled to a photodetector for receiving an incoming optical signal;
   a first temperature control circuit for controlling a temperature of a first region of the optical device over a first range of temperatures between a first predetermined temperature and a fourth predetermined temperature based on an ambient temperature at the optical device's location, wherein at least part of the first range of temperatures is outside of an operational temperature range of the tunable element; and
   a second temperature control circuit for controlling a temperature of a second region of the optical device over a second range of temperatures between a second predetermined temperature and a third predetermined temperature based at least in part on a temperature of the temperature-dependent tunable element, wherein the second region includes a portion of the first region, wherein the second region is smaller than the first region, and wherein the tunable element is positioned in the second region such that a temperature of the tunable element is controlled based on the second temperature control circuit controlling the temperature of the second region, wherein the second range of temperatures corresponds to the operational temperature range of the tunable element, and wherein the second predetermined temperature is greater than the first predetermined temperature, the third predetermined temperature is greater than the second predetermined temperature, and the fourth predetermined temperature is greater than the third predetermined temperature.

2. The optical device of claim 1, wherein at least one of the first and second temperature control circuits is a thermoelectric cooler.

3. The optical device of claim 1, wherein the second temperature control circuit is configured to control the temperature of the tunable element across a range of at least 24° C.

4. The optical device of claim 1, wherein the device is an optical transceiver comprising each of the laser, the photodetector, and the optical filter.

5. The optical device of claim 4, wherein the laser is configured to transmit an optical signal at any of at least four different wavelengths, and wherein the wavelength of the optical signal transmitted by the laser is based on the temperature of the laser.

6. The optical device of claim 4, wherein the optical transceiver is configured to perform one of wavelength-division multiplexing (WDM), dense wavelength-division multiplexing (DWDM), and coarse wavelength-division multiplexing (CWDM).

7. The optical device of claim 1, wherein the second region is defined by a housing, and wherein the second temperature control circuit is configured to control the temperature inside the housing, and wherein the housing is configured to confine an effect of the second temperature control circuit to the second region.

8. The optical device of claim 1, wherein the first temperature control circuit is communicatively coupled to the second temperature control circuit and operable to provide an indication of the temperature of the first region to the second temperature control circuit, and wherein the second temperature control circuit is configured to control the temperature of the second region based on the indication of the temperature of the first region.

9. The optical device of claim 1, further comprising a control circuit configured to receive an indication of the ambient temperature at the optical device's location, and to control the respective temperatures of the first and second regions with respect to each other based on the indication of the ambient temperature.

10. The optical device of claim 1, wherein the second temperature control circuit is configured to heat the tunable element, and wherein the wherein the first temperature control circuit maintains the first region at a temperature lower than the second temperature control circuit maintains the second region, whereby when the second temperature control circuit is off, the tunable element is cooled, and when the second temperature control circuit is on, the tunable element is heated.

11. The optical device of claim 1, wherein the second temperature circuit is configured to adjust the temperature of the second region at a faster rate than the first temperature circuit is configured to adjust the temperature of the first region.

12. The optical device of claim 1, wherein the first temperature control circuit is configured to create a local heat sinking region in the first region, the heat sinking region having a temperature that is lower than the ambient temperature at the optical device's location, and wherein the heat sinking region is configured to accelerate a change to the temperature of the second region.

13. The optical device of claim 12, wherein the optical device further comprises a casing, and wherein the local heat sinking region is defined by the casing of the device.

14. A control system included in a device having at least one of (i) a tunable optical transmitter configured to selectively generate a first optical signal at one of a plurality of preselected wavelengths or (ii) an optical receiver coupled to a tunable optical bandpass filter configured to selectively pass a second optical signal at one of a plurality of preselected wavelengths, wherein the control system is configured to:
receive one or more temperature-indicative measurements from a plurality of corresponding sensors including a first sensor and a second sensor, wherein the first sensor senses an ambient temperature at a location of the device, and wherein the second sensor senses a property of the tunable optical transmitter or the tunable optical bandpass filter other than temperature that is indicative of a temperature of the tunable optical transmitter or the tunable optical bandpass filter;
transmit a first control signal to a first temperature control circuit to control a temperature of the device within a first range of temperatures based on the temperature-indicative measurements received from the first sensor; and
transmit a second control signal to a second temperature control circuit to control a temperature of the tunable optical transmitter or the tunable optical bandpass filter within a second range of temperatures based on one of the temperature-indicative measurements received from the second sensor, wherein the second range of temperatures is narrower than the first range of temperatures.

15. The control system of claim 14, wherein the control system comprises:
a first control circuit coupled to the first sensor, wherein the first control signal is based on a first temperature measurement of the first temperature sensor; and
a second control circuit coupled to the second sensor, wherein the second control signal is based on the property sensed by the second sensor.

16. The control system of claim 14, wherein the control system is configured to provide control signals to both the first and second temperature control circuits based on the one or more temperature-indicative measurements of the first sensor.

17. The control system of claim 14, wherein the second temperature control circuit is configured to receive one or more instruction signals from the first temperature control circuit, and wherein the second control signal is based further on the one or more instruction signals.

18. The control system of claim 14, wherein the control system is configured to control the temperature of the tunable optical transmitter or the tunable optical bandpass filter across a range of at least 24° C.

19. The control system of claim 14, wherein the device includes each of the tunable optical transmitter, the optical receiver, and the optical bandpass filter coupled to the receiver, and wherein the second control signal controls the temperature of the optical transmitter and the optical bandpass filter and is based on at least one of the received temperature-indicative measurements.

20. The control system of claim 14, wherein the second range of temperatures is within the first range of temperatures.

21. A method for controlling a device having at least one of (i) a tunable optical transmitter configured to selectively generate a first optical signal at one of a plurality of preselected wavelengths or (ii) an optical receiver coupled to a tunable optical bandpass filter configured to selectively pass a second optical signal at one of a plurality of preselected wavelengths, wherein the method comprises:

receiving one or more temperature-indicative measurements from one or more corresponding sensors including a first sensor and a second sensor, wherein the first sensor senses an ambient temperature at a location of the device, and wherein the second sensor senses a property of the tunable optical transmitter or the tunable optical bandpass filter other than temperature that is indicative of a temperature of the tunable optical transmitter or the tunable optical bandpass filter;

transmitting a first control signal to a first temperature control circuit to control a temperature of the device within a first range of temperatures based on the temperature-indicative measurements received from the first sensor; and transmitting a second control signal to a second temperature control circuit to control a temperature of the tunable optical transmitter or the tunable optical bandpass filter within a second range of temperatures based on one of the temperature-indicative measurements received from the second sensor, wherein the second range of temperatures is narrower than the first range of temperatures.

* * * * *